United States Patent [19]
Yamaguchi

[11] Patent Number: 5,847,421
[45] Date of Patent: Dec. 8, 1998

[54] LOGIC CELL HAVING EFFICIENT OPTICAL PROXIMITY EFFECT CORRECTION

[75] Inventor: Akira Yamaguchi, Yokohama, Japan

[73] Assignee: Kabushiki Kaisha Toshiba, Kawasaki, Japan

[21] Appl. No.: 891,842

[22] Filed: Jul. 14, 1997

[30] Foreign Application Priority Data

Jul. 15, 1996 [JP] Japan ..................................... 8-204236

[51] Int. Cl.$^6$ .................................................. H01L 27/10
[52] U.S. Cl. .......................................... 257/207; 257/202
[58] Field of Search ........................... 257/202–211, 503, 257/500, 508

[56] References Cited

U.S. PATENT DOCUMENTS

| | | | |
|---|---|---|---|
| 5,066,997 | 11/1991 | Sakurai et al. ........................... | 257/211 |
| 5,441,915 | 8/1995 | Lee ......................................... | 257/211 |
| 5,534,724 | 7/1996 | Nagamine ............................... | 257/202 |
| 5,553,273 | 9/1996 | Liebmann ............................... | 395/500 |
| 5,663,017 | 9/1997 | Schinella et al. ........................ | 430/5 |
| 5,682,323 | 10/1997 | Pasch et al. ............................. | 257/390 |
| 5,705,301 | 1/1998 | Garza et al. ............................. | 430/5 |
| 5,723,233 | 3/1998 | Garza et al. ............................. | 430/5 |

*Primary Examiner*—David B. Hardy
*Attorney, Agent, or Firm*—Finnegan, Henderson, Farabow, Garrett & Dunner, L.L.P.

[57] ABSTRACT

There are provided a semiconductor device, basic cell library, a method for manufacturing a semiconductor device, and a method and mask for forming a basic cell library which can reduce the amount of poly-data to be corrected by the optical proximity effect correction (OPC), reduce the CAD processing time, perform correction by the OPC for each cell, and reduce the product turn around time. A basic cell registered in the basic cell library has a dummy wiring pattern previously formed on the peripheral portion thereof. With this structure, the distance between a polysilicon gate used in a circuit and the polysilicon wiring of an adjacent dummy wiring pattern in the basic cell can be determined in the cell. As a result, variations in the poly-widths of all of the polysilicon gates in the basic cell due to the optical proximity effect can be estimated, and therefore, a correction value by the OPC on a mask for correcting the gate width based on the variation in the poly-width can be determined in the cell.

55 Claims, 10 Drawing Sheets

E CELL

MASK

LOGIC CELL HAVING EFFICIENT OPTICAL PROXIMITY EFFECT CORRECTION

BACKGROUND OF THE INVENTION

This invention relates to a semiconductor device having a semiconductor integrated circuit laid out on a semiconductor substrate based on a basic cell library having basic cells of novel structure and a method for manufacturing the same.

A semiconductor device is manufactured basically via a design process (function design, logic design, layout design and the like) and a manufacturing and test process (chip manufacturing process, test evaluation process and the like). The design process is effected in an order of function design→logic design→layout design.

At present, the process technology of the semiconductor device enters upon the deep submicron generation. Under this situation, the width of wirings used in the semiconductor device is reduced to 0.3 $\mu$m or less. However, for example, a reduction in the wiring width of the polysilicon wiring (which is hereinafter referred to as the poly-width) or the like causes a problem that a minute variation in the poly-width caused by the optical proximity effect cannot be neglected.

The optical proximity effect (OPE) is a phenomenon that the finish value of the poly-width W of the polysilicon wiring will vary according to a space d between the polysilicon wiring and an adjacent polysilicon wiring (which is hereinafter referred to as a poly-space). That is, the size of the pattern in the semiconductor device is reduced and the integration density thereof is enhanced, and a charged beam exposure device or an optical stepper is used to draw and expose the pattern, but at this time, the dimensional precision of the pattern is lowered by the optical proximity effect.

FIGS. 1A and 1B are a plan view of a polysilicon wiring pattern and a characteristic diagram for illustrating the dependency of the wiring width on the space between the wirings which varies by the optical proximity effect. In FIG. 1B, the ordinate indicates the poly-width W ($\mu$m) and the abscissa indicates the poly-space d ($\mu$m). For example, when a plurality of polysilicon wirings with the poly-width W of 0.3 $\mu$m are arranged in close proximity to one another, there occurs a phenomenon that the poly-width W is reduced to approx. 0.26 $\mu$m when the poly-space d becomes approx. 1 $\mu$m. Therefore, at the time of manufacturing the semiconductor device, it becomes absolutely necessary to make correction in order to enhance the dimensional precision of the pattern which is lowered by the optical proximity effect when the pattern for wirings or the like to be formed on the semiconductor device is drawn or exposed.

An OPC (Optical Proximity effect Correction) technique is considered as the technique for compensating for the optical proximity effect. The OPC technique is a technique for keeping the finish value of the poly-width after exposure at a constant value by estimating an amount of variation in the poly-width due to the optical proximity effect of the polysilicon wirings based on the distance between the polysilicon wiring and an adjacent polysilicon wiring pattern in close proximity thereto and previously correcting the mask value of a photoresist for forming the polysilicon wiring to cancel the variation amount. In the conventional layout, the polysilicon wiring pattern is not standardized, the polyspace is different depending on polysilicon wirings of the whole chip, and therefore, it is necessary to make corrections by the OPC technique for all of the polysilicon wirings on the chip.

The basic cell library used for laying out a conventional standard cell type semiconductor device or the like is shown in the plan views of basic cells of FIGS. 2A to 2C and FIG. 3, for example. FIG. 2A shows an A cell registered in the basic cell library and one pair of diffusion regions 2 acting as source/drain regions are formed in a cell frame 1 in which a cell region is formed. The diffusion regions 2 include a p+ diffusion region 21 and an n+ diffusion region 22 and one polysilicon gate 3 is disposed to extend over the diffusion regions 21, 22. FIG. 2B shows a B cell registered in the basic cell library and two polysilicon gates 3 are disposed to extend over a p+ diffusion region 21 and n+ diffusion region 22. FIG. 2C shows a C cell registered in the basic cell library and three polysilicon gates 3 are disposed to extend over a p+ diffusion region 21 and n+ diffusion region 22. FIG. 3 shows an E cell registered in the basic cell library and three polysilicon gates 3 are disposed to selectively extend over p+ diffusion regions 211, 221 and n+ diffusion regions 212, 222.

FIGS. 4 and 5 are plan views of chips on which standard cells are laid out. On a chip 10, basic cells (A, B, C) registered in the basic cell library are placed. In the case of FIG. 4, the basic cells A, B, C are successively placed in an order of ABC in a preset portion of the chip. In the case of FIG. 5, the basic cells are successively placed in an order of CBA in a preset portion of the chip. The positional relation between a target polysilicon gate (D) 3 (which is hereinafter referred to as a poly-data D) in FIGS. 4 and 5 and a polysilicon gate (E, F) 3 (which is hereinafter referred to as a proximity poly-data E, F) in close proximity thereto on the chip 10 is explained. In the case of FIG. 4, the poly-data D is disposed in close proximity to the proximity poly-data E. The proximity poly-data E is bent and a poly-space b1 between the poly-data D and a portion of the proximity poly-data E which is formed above the diffusion region 21 is larger than a poly-space b2 between the poly-data D and a portion of the proximity poly-data E which is formed above the diffusion region 22. In the case of FIG. 5, the poly-data D is disposed in close proximity to the proximity poly-data F. Poly-spaces between the poly-data D and both end portions of the proximity poly-data F are b3 and b4. Therefore, if b2, b3 and b4 are set equal to each other, the poly-space b1 becomes larger than b4 (b1>b4).

Thus, the distance between the poly-data and the proximity poly-data is different depending on a difference in the placement of the basic cells on the chip.

Therefore, in the design process in the conventional manufacturing method of the semiconductor device, after the function design, logic design and layout design are performed, a mask value correction for formation of correct pattern is made by taking the optical proximity effect into consideration.

FIG. 6 is a plan view of a basic cell for illustrating the mask value correction for a variation due to the optical proximity effect. As shown in FIG. 6, since the poly-width varies according to the distance to the proximity poly-data, the poly-width of the poly-data G on the mask is increased (increased width c) while monitoring the relation between the poly-width of the poly-data G and the poly-space b. Thus, in the case of FIG. 6, the poly-width is changed according to the distance b to the adjacent poly-data.

The wiring pattern is formed in the chip forming process by use of a mask which has been subjected to the correction process for the optical proximity effect.

In most cases, the poly-datas which should be corrected by the OPC technique lie only in the cell region as shown in FIG. 6. Therefore, if the poly-width is corrected by the OPC technique not in the whole portion of the chip but in the respective cell regions, the number of poly-datas subjected to the OPC process is significantly reduced and the amount of processing is reduced. However, in the cells used now, as shown in FIG. 7, the distance from the poly-data used in the cell to the proximity poly-data is not definite inside the cell, and only when the standard cell is laid out on the chip, the distance from a preset poly-data (polysilicon gate) to an adjacent poly-data (proximity poly-data) is determined.

Further, since the distance from the poly-data to a proximity poly-data adjacent thereto varies even in the same cell depending on a cell disposed in an adjacent position, the amount of variation in the poly-width due to the optical proximity effect is changed. Therefore, correction of the mask width of the poly-width by the OPC technique cannot be performed until the cell layout is completed, thereby causing a problem that the delay in TAT (Turn Around Time) and an increase in the amount of processing will occur.

BRIEF SUMMARY OF THE INVENTION

This invention has been made to solve the above problem, and an object of this invention is to provide a semiconductor device capable of reducing the amount of the poly-data to be corrected by the OPC technique, reducing the CAD processing time and reducing the product TAT by performing correction by the OPC technique for each cell, a basic cell library for realizing the semiconductor device, a method for manufacturing the semiconductor device, a method for forming the basic cell library, and a mask for manufacturing the semiconductor device.

This invention is characterized in that a poly-data which is the dummy wiring pattern of a polysilicon wiring pattern is additionally formed along the periphery of a basic cell in the semiconductor device. That is, the basic cell registered in the basic cell library is characterized in that the dummy wiring pattern is previously formed along the periphery thereof. With this structure, the distance between the poly-silicon gate used in the circuit and a polysilicon wiring of the dummy wiring pattern formed in close proximity thereto in the basic cell can be determined in the cell. As a result, since the amount of variation in the poly-width due to the optical proximity effect of all of the polysilicon gates in the basic cell can be estimated, the correction value by the OPC technique on the mask used for correcting the gate width based on the variation amount of the poly-width can be determined only inside the cell. Further, the correction can be previously performed not for each product but for each cell.

In this invention, since dummy wiring patterns are formed in the respective basic cells which are previously registered in the basic cell library, the poly-width correction process effected for the optical proximity effect after the cell placement in the design process containing a continuous process of function design→logic design→layout design can be omitted.

That is, since the basic cell library is corrected by the OPC process before the cells of the product (chip) are placed, it is not necessary to perform the OPC process at the time of development of the product, the delay in the TAT caused by correction by the OPC technique for each product can be prevented, and a mask for the optimum polysilicon wiring pattern can be easily formed. Further, since the correction value of each poly-data in the basic cell is not dependent on the poly-data of the adjacent cell and is determined by the poly-data in the basic cell, it is sufficient only if the correction is performed once for each basic cell and the correction processing data amount can be made smaller than in a case wherein the correction is performed for the whole portion of the chip.

This invention described in claim 1 is characterized by including at least one basic cell having a dummy cell pattern placed on the peripheral portion thereof in a semiconductor device. A basic cell library of this invention described in claim 17 is characterized in that at least one basic cell having a dummy wiring pattern is formed. A method for forming a basic cell library of this invention described in claim 22 is characterized by including a step of preparing a first basic cell of first layout structure for realizing a plurality of basic gates on a semiconductor substrate, and a step of forming a second basic cell by placing a dummy wiring pattern on the peripheral portion of the first basic cell.

A method for manufacturing a semiconductor device of this invention described in claim 25 is characterized by including a step of preparing a first basic cell of layout structure for realizing a plurality of basic gates on a semiconductor substrate, a step of forming a second basic cell by forming a dummy wiring pattern on the region boundary of the first basic cell, and a step of laying out a semiconductor integrated circuit on the semiconductor substrate by using the second basic cell. A method for manufacturing a semiconductor device of this invention described in claim 27 is characterized by including a step of preparing plural types of basic cells having dummy wiring patterns formed along the region boundaries thereof, and a step of selecting at least two basic cells from the plural types of basic cells, overlapping parts of the dummy wiring patterns of the selected basic cells to form a new basic cell, and stocking the new basic cell in the basic cell layout library. A mask of this invention described in claim 28 is characterized in that at least one basic cell portion having a dummy wiring pattern arranged on the peripheral portion thereof is formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described embodiments of this invention with reference to the accompanying drawings.

Figure 1A:
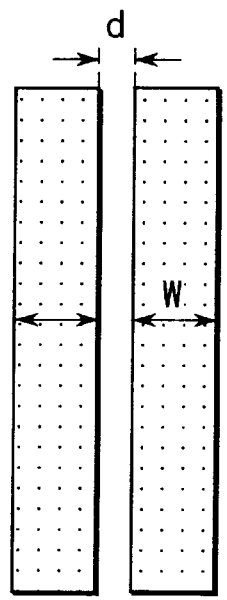
FIGS. 1A and 1B are a characteristic diagram and wiring pattern plan view for illustrating the dependency of the wiring width which is changed by the optical proximity effect on the distance between wirings.
Figure 1B:
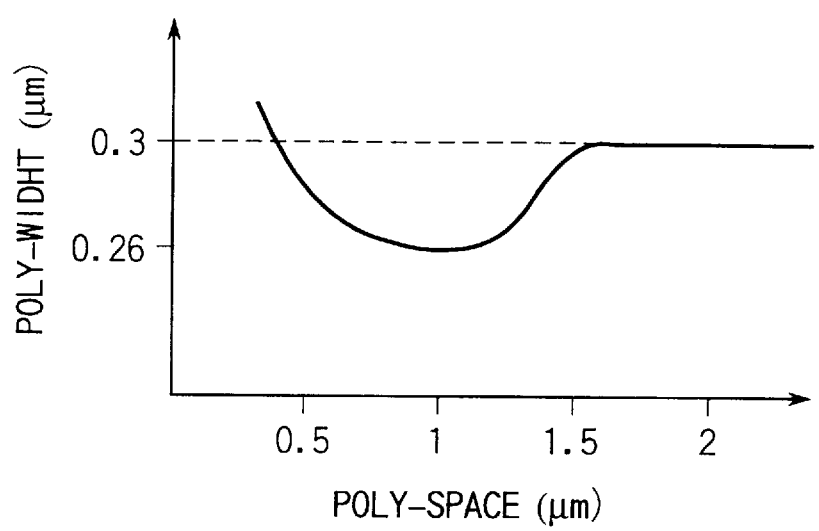
Figures 2A, 2B, 2C:
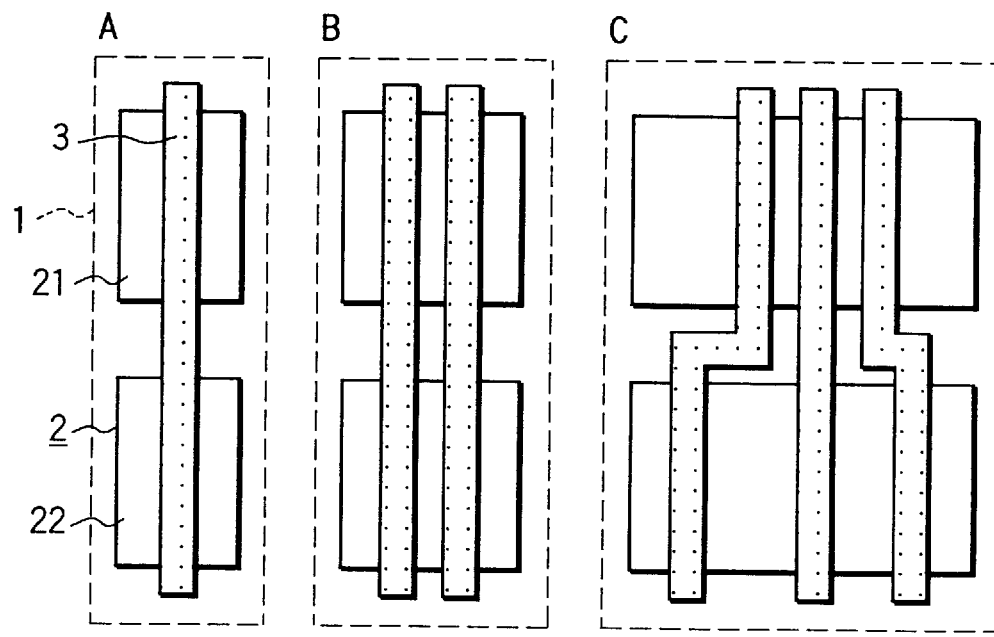
FIGS. 2A, 2B and 2C are plan views of conventional basic cells of the basic cell library.
Figure 3:
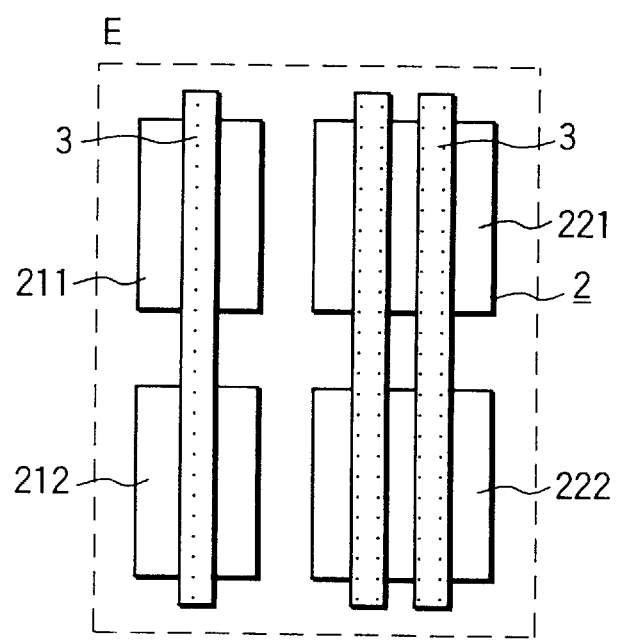
FIG. 3 is a plan view of a conventional basic cell of the basic cell library.
Figure 4:
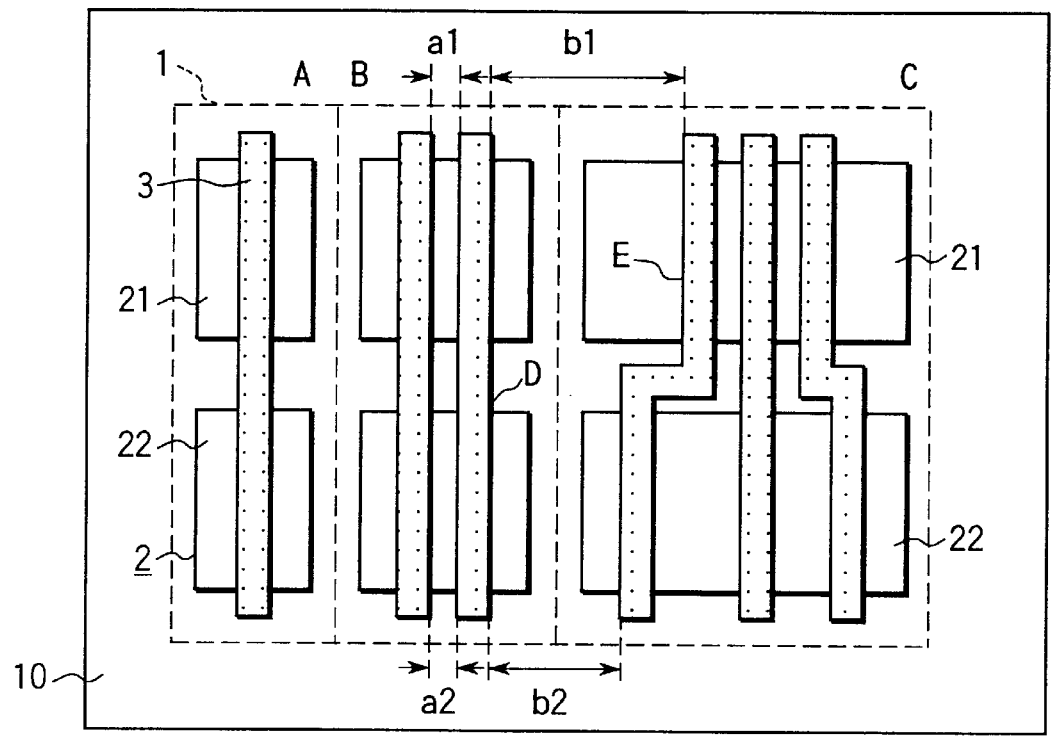
FIG. 4 is a plan view of a chip on which conventional basic cells are arranged.
Figure 5:
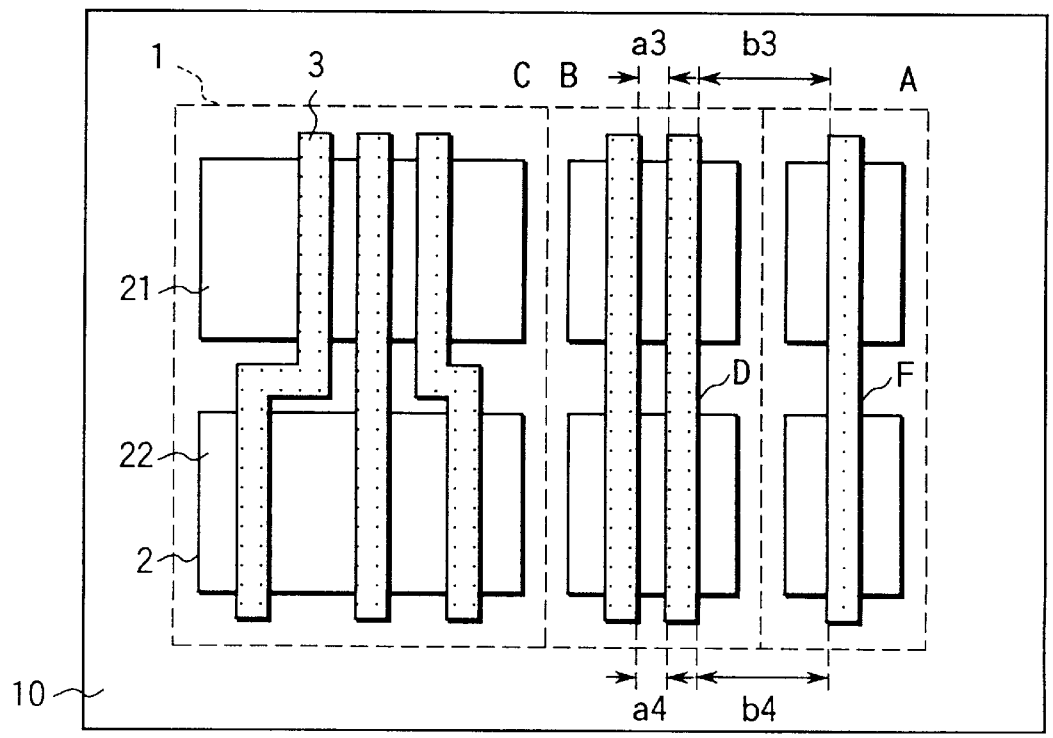
FIG. 5 is a plan view of a chip on which conventional basic cells are arranged.
Figure 6:
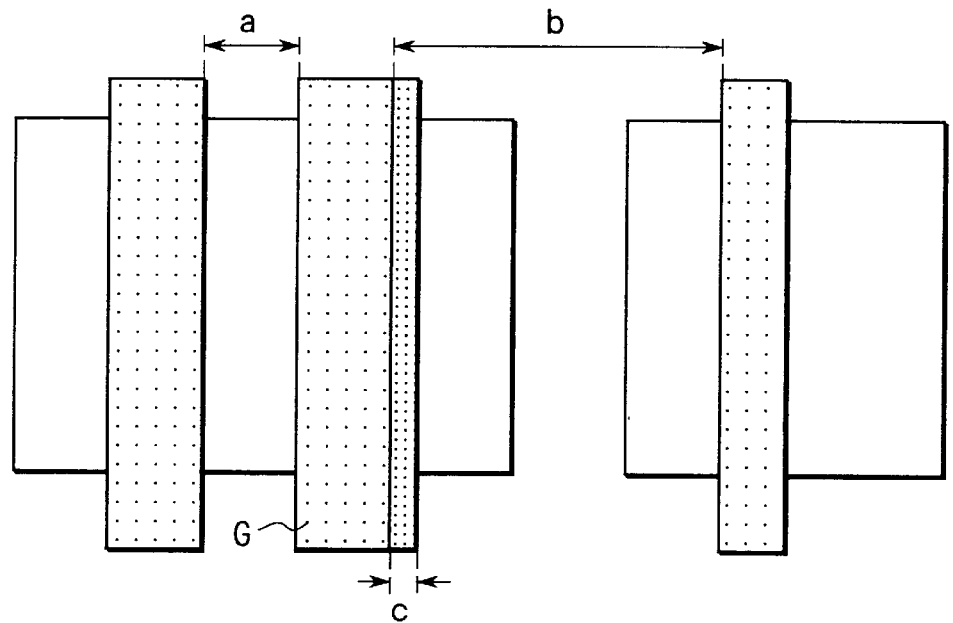
FIG. 6 is a view for illustrating correction of a mask value for the optical proximity effect.
Figures 7A, 7B, 7C:
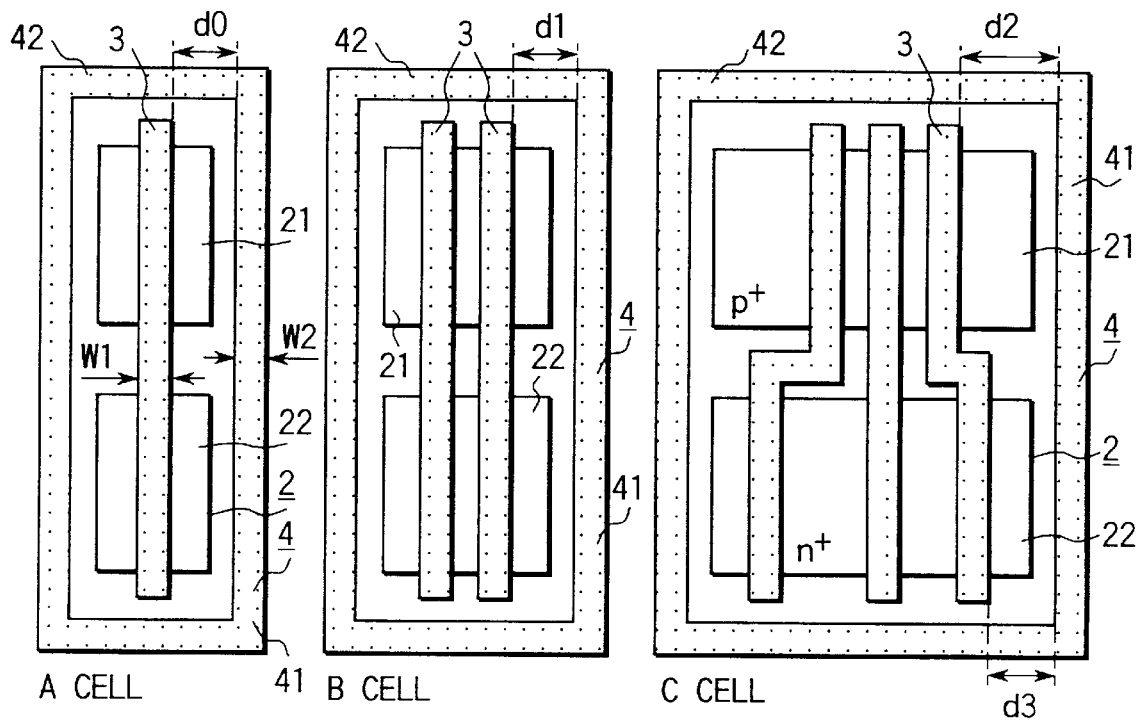
FIGS. 7A, 7B and 7C are plan views showing basic cells of the basic cell library of this invention.

First, a first embodiment of this invention is explained with reference to FIGS. 7A, 7B, 7C and FIG. 8 which are plan views showing basic cells registered in the basic cell library of this invention. In the basic cell library, basic cells used for constructing a semiconductor integrated circuit are registered, and at the time of manufacturing a semiconductor device, the basic cells registered in the basic cell library are adequately selected to make a layout design for forming a logic circuit. The basic cells of this invention shown in the above drawing are used for laying out a standard cell type semiconductor device. The basic cell has a layout structure for realizing a plurality of basic gates on a substrate and is constructed by an internal wiring such as a gate, diffusion regions and a dummy wiring pattern which is the important factor of this invention. The basic cell includes an inverter, 2-input NAND, flip-flop, EX-OR, AND, NOR and is a layout structure for realizing a basic gate on the semiconductor substrate. FIG. 7A shows an A cell registered in the basic cell library. A dummy wiring pattern 4 of a polysilicon wiring pattern is formed along the cell frame which defines a cell region. That is, the cell region is surrounded by the dummy wiring pattern 4.

In the cell region, one pair of diffusion regions (SDG) 2 used as source/drain regions are formed. The diffusion regions 2 include a p+ diffusion region 21 and n+ diffusion region 22 and one polysilicon gate 3 is formed to extend over the diffusion regions 21, 22. In this embodiment, the gate width w1 of the polysilicon gate 3 and the pattern width w2 of the dummy wiring pattern 4 are both set to 0.3 μm, for example. The dummy wiring pattern 4 is formed of portions 41 which are parallel to the polysilicon gate 3 and portions 42 which are perpendicular to the polysilicon gate 3. The parallel portion 41 causes a variation in the gate width due to the optical proximity effect in the polysilicon gate 3, but since the distance d0 between the polysilicon gate 3 and the dummy wiring pattern 4 is constant, correction can be previously made in the state of basic cell if a variation in the gate width occurs in the polysilicon gate 3. FIG. 7B shows a B cell registered in the basic cell library, and two polysilicon gates 3 are each formed to extend over the p+ diffusion region 21 and n+ diffusion region 22. A dummy wiring pattern 4 of a polysilicon wiring pattern having the same width as the gate width of the polysilicon gate is formed to surround a cell region. Like the A cell, the dummy wiring pattern 4 is formed of portions 41 which are parallel to the polysilicon gate 3 and portions 42 which are perpendicular to the polysilicon gate 3.

Since the distance d1 between one of the polysilicon gates 3 which lies on the right-hand side and the dummy wiring pattern 4 is constant, correction can be previously made in the state of basic cell if a variation in the gate width occurs in the polysilicon gate 3. FIG. 7C shows a C cell registered in the basic cell library, and three polysilicon gates 3 are each formed to extend over the p+ diffusion region 21 and n+ diffusion region 22. A dummy wiring pattern 4 of a polysilicon wiring pattern having the same width as the gate width of the polysilicon gate is formed to surround a cell region. Like the A cell, the dummy wiring pattern 4 is formed of portions 41 which are parallel to the polysilicon gate 3 and portions 42 which are perpendicular to the polysilicon gate 3. Since the distances d2, d3 between two of the polysilicon gates 3 which lie on the right-hand side and the dummy wiring pattern 4 are predetermined, correction can be previously made in the state of basic cell if a variation in the gate width occurs in the polysilicon gate 3.

Figure 8:
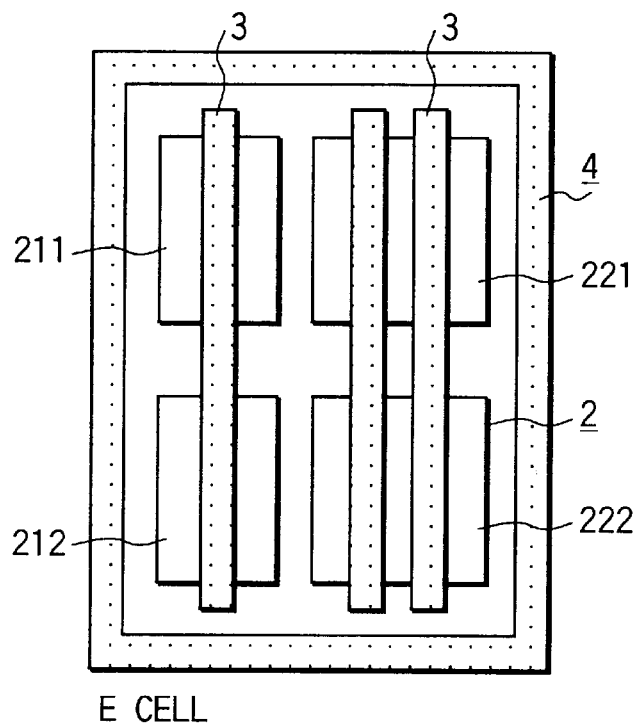
FIG. 8 is a plan view showing a basic cell of the basic cell library of this invention.

FIG. 8 shows an E cell registered in the basic cell library. A dummy wiring pattern 4 of a polysilicon wiring pattern is formed along the cell frame which defines a cell region. In the cell region, diffusion regions 2 are formed.

The diffusion regions 2 include p+ diffusion region 211, 221 and n+ diffusion regions 212, 222, one polysilicon gate 3 is formed to extend over the diffusion regions 211, 212, and two polysilicon gates 3 are each formed to extend over the diffusion regions 221, 222. The gate width of the polysilicon gate 3 and the pattern width of the dummy wiring pattern 4 are both set to 0.3 μm, for example. The dummy wiring pattern 4 is formed of portions which are parallel to the polysilicon gate 3 and portions which are perpendicular to the polysilicon gate 3. The parallel portion causes a variation in the gate width due to the optical proximity effect in the polysilicon gate 3, but since the distance between the polysilicon gate 3 and the dummy wiring pattern 4 is constant, correction can be previously made in the state of basic cell if a variation in the gate width occurs in the polysilicon gate 3.

In the standard cell type semiconductor device, basic cells are selected from the basic cell library and laid out on the chip. In this invention, the design process is completed by laying out the basic cells such as the A cell, B cell, C cell, E cell shown in FIGS. 7A, 7B, 7C and FIG. 8 on the chip and then the chip forming process is started. Since it is not necessary to newly form a dummy wiring pattern for correcting a variation due to the optical proximity effect at the time of change of the process, the process can be simplified.

As described before, a variation in the width due to the optical proximity effect occurs in the wiring pattern, but in some cases, a reduction in the width of the wiring depending on the layout may occur, and it is also important to compensate for the reduction in order to precisely form the wiring pattern. The dummy wiring pattern of this invention can effectively cope with this compensation.

Thus, in this invention, the dummy wiring pattern forming process for compensating for the optical proximity effect effected after the layout design can be omitted. That is, since the basic cell library is subjected to correction by the OPC technique before the cells of the product (chip) are placed, it is not necessary to effect the OPC process at the time of development of the product, the delay in the TAT caused by correction by the OPC technique for each product can be prevented, and an optimum mask of the polysilicon wiring pattern can be easily formed.

Figure 9:
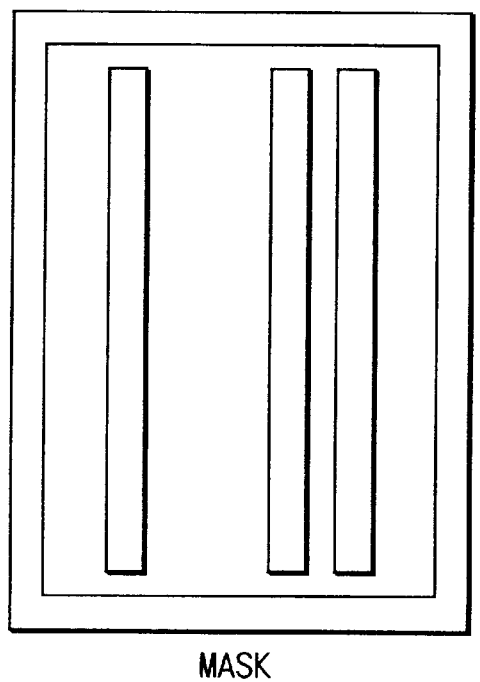
FIG. 9 is a plan view showing a mask formed based on the basic cell of this invention.

A mask for forming a pattern on the semiconductor substrate is formed based on the layout design. FIG. 9 is a plan view showing part of a mask formed by use of the basic cell of FIG. 8. Also, in the following embodiments, the mask is formed in the same manner as described above.

Further, since the correction value of each polysilicon wiring pattern in the basic cell is determined by the polydata in the basic cell, it is sufficient only if the correction is performed once for each basic cell and the correction processing data amount can be made smaller than in a case wherein the correction is performed for the whole portion of the chip.

Next, a second embodiment is explained with reference to FIG. 10.

Figure 10:
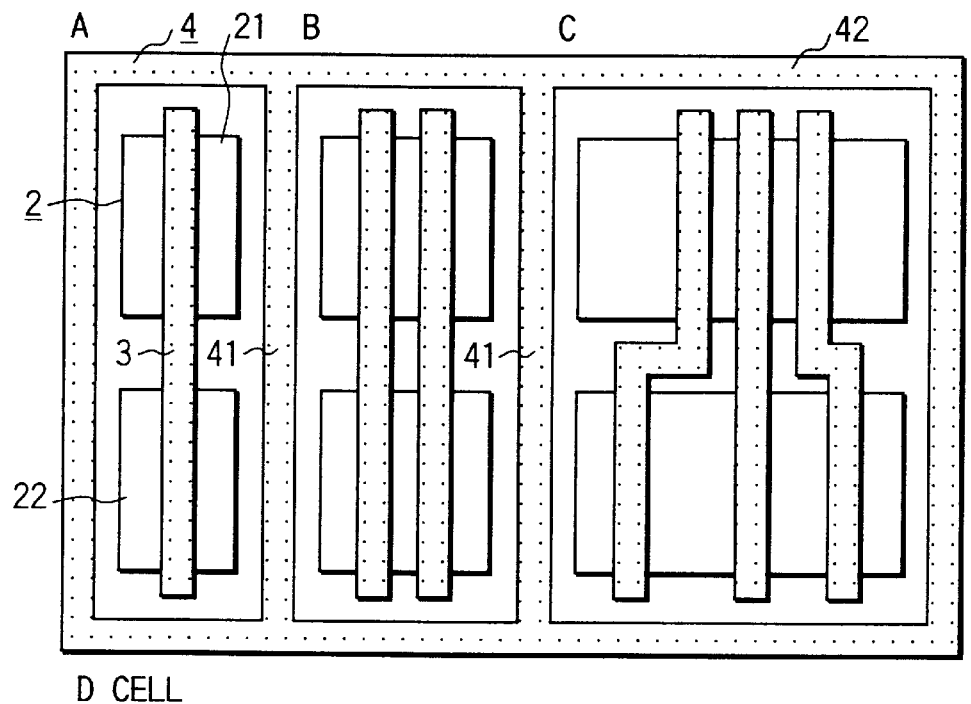
FIG. 10 is a plan view showing a basic cell of the basic cell library of this invention.

FIG. 10 is a plan view of a basic cell registered in the basic cell library. The basic cell (D cell) shown in FIG. 10 is used for the layout of a standard cell type semiconductor device. The D cell is constructed by combining the A cell, B cell and C cell of the basic cell library shown in FIGS. 7A, 7B and 7C. The basic cell is formed of a combination of the cells placed in an order of ABC, but can be formed of a combination of the cells placed in an order of BAC, CAB, ACB, BCA, CBA, and the basic cells thus formed are registered as different basic cells in the basic cell library. Further, structures obtained by placing desired two of the A, B and C regions in desired combinations are registered as basic cells in the basic cell library. Thus, when a new basic cell is formed by combining the basic cells, the dummy wiring pattern is formed on the peripheral portion of the original basic cell for each original basic cell. The A, B and C regions are respectively correspond to the original A cell, B cell and C cell. Therefore, the portion 41 which is parallel to the polysilicon gate 3 of the dummy wiring pattern 4 is formed between the regions. Further, the dummy wiring pattern 4 of a polysilicon wiring pattern is formed along the cell frame which defines a cell region. That is, the cell region is surrounded by the dummy wiring pattern 4.

In the cell region, one pair of diffusion regions (SDG) 2 used as source/drain regions are formed in each of the A, B, C regions. The diffusion regions 2 include a p+ diffusion region 21 and an n+ diffusion region 22 and one to three polysilicon gates 3 are each formed to extend over the diffusion regions 21, 22. In this embodiment, the gate width of the polysilicon gate 3 and the pattern width of the dummy wiring pattern 4 are both set to 0.3 $\mu$m, for example. The dummy wiring pattern 4 is formed of portions 41 which are parallel to the polysilicon gate 3 and portions 42 which are perpendicular to the polysilicon gate 3. The parallel portion 41 causes a variation in the gate width due to the optical proximity effect in the polysilicon gate 3, but since the distance between the polysilicon gate 3 and the dummy wiring pattern 4 is constant, correction can be previously made in the state of basic cell if a variation in the gate width occurs in the polysilicon gate 3.

Thus, in this invention, the dummy wiring pattern forming process for compensating for the optical proximity effect effected after the layout design can be omitted. That is, since the basic cell library is subjected to correction by the OPC technique before the cells of the product are placed, it is not necessary to effect the OPC process at the time of development of the product, the delay in the TAT caused by correction by the OPC technique for each product can be prevented, and an optimum mask of the polysilicon wiring pattern can be easily formed.

Further, since the correction value of each polysilicon wiring pattern in the basic cell is determined by the polydata in the basic cell, it is sufficient only if the correction is performed once for each basic cell and the correction processing data amount can be made smaller than in a case wherein the correction is performed for the whole portion of the chip.

In this invention, it is possible to form a new basic cell based on the basic cells already registered in the basic cell library and register the newly formed basic cell into the basic cell library.

Figures 11A, 11B, 11C:
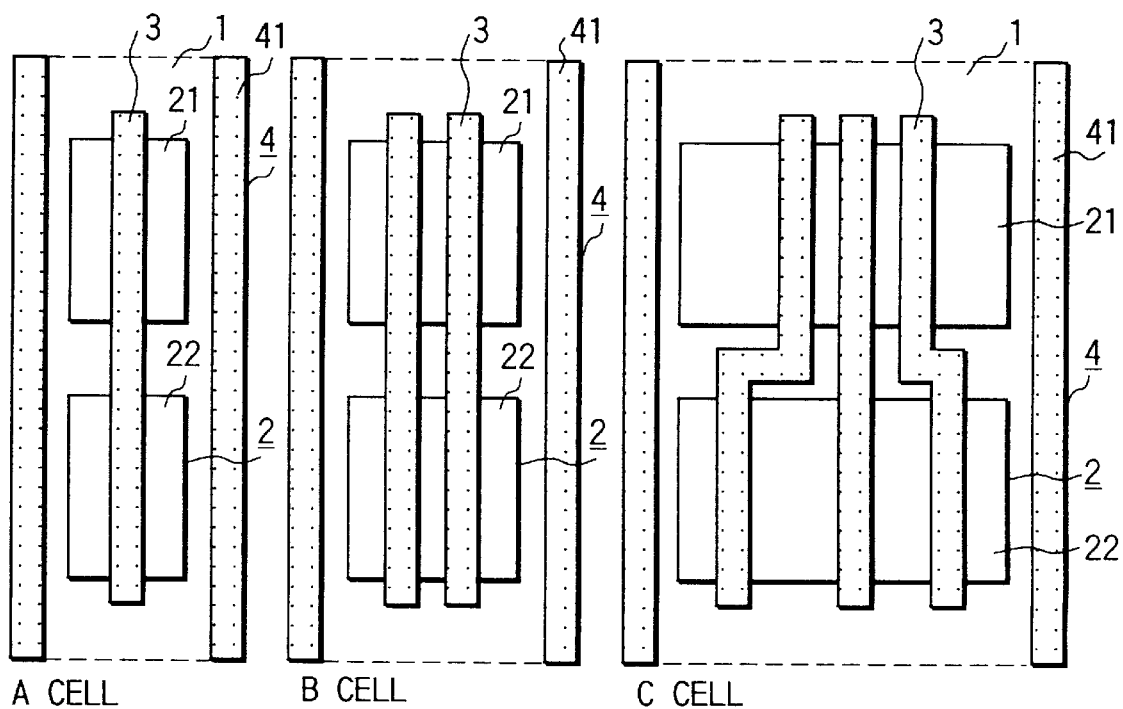
FIGS. 11A, 11B and 11C are plan views showing basic cells of the basic cell library of this invention.
Figure 12:
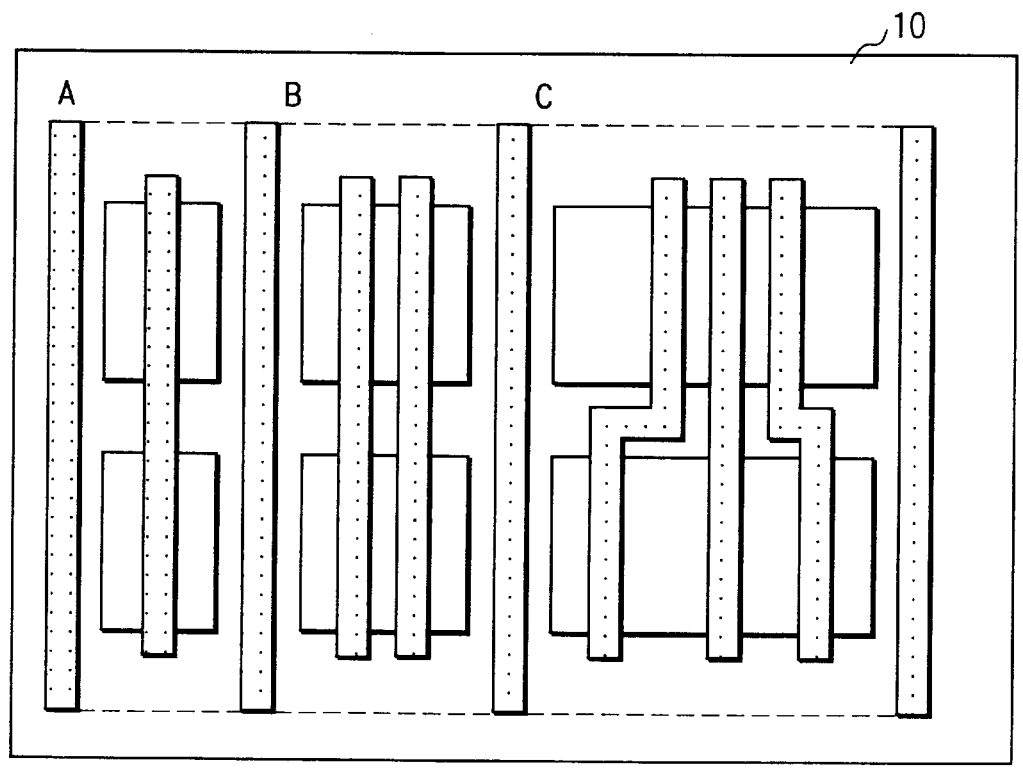
FIG. 12 is a plan view showing a chip on which basic cells of this invention are arranged.

Next, a third embodiment is explained with reference to FIGS. 11A, 11B, 11C and FIG. 12. FIGS. 11A, 11B and 11C are plan views of basic cells in the basic cell library of this invention and FIG. 12 is a plan view showing a chip on which the basic cells of FIGS. 11A, 11B and 11C are placed. The basic cells of this invention shown in the drawing are used for the layout of a standard cell type semiconductor device. FIG. 11A shows an A cell registered in the basic cell library. The basic cell has a dummy wiring pattern 4 of a polysilicon wiring pattern formed along a cell frame 1 which defines a cell region. In this embodiment, the dummy wiring pattern 4 is formed of only portions 41 which are parallel to the polysilicon gate 3. Since the parallel portion 41 causes a variation in the gate width due to the optical proximity effect in the polysilicon gate 3, the dummy wiring pattern 4 does not necessarily require portions which are perpendicular to the polysilicon gate 3. The dummy wiring pattern is formed in parallel to the internal wiring and has the same width as and substantially the same length as the internal wiring. In the cell region, one pair of diffusion regions 2 used as source/drain regions are formed. The diffusion regions include a p+ diffusion region 21 and n+ diffusion region 22 and one polysilicon gate 3 is formed to extend over the diffusion regions 21, 22. In this example, the gate width of the polysilicon gate 3 and the pattern width of the dummy wiring pattern 4 are both set to 0.3 $\mu$m, for example. Since the distance between the polysilicon gate 3 and the dummy wiring pattern 4 is constant, correction can be previously made in the state of basic cell if a variation in the gate width occurs in the polysilicon gate 3.

FIG. 11B shows a B cell registered in the basic cell library, and two polysilicon gates 3 are each formed to extend over the p+ diffusion region 21 and n+ diffusion region 22. A dummy wiring pattern 4 of a polysilicon wiring pattern having the same width as the gate width of the polysilicon gate is formed to surround a cell region. Like the A cell, the dummy wiring pattern 4 is formed of portions 41 which are parallel to the polysilicon gate 3. FIG. 11C shows a C cell registered in the basic cell library, and three polysilicon gates 3 are each formed to extend over the p+ diffusion region 21 and n+ diffusion region 22. A dummy wiring pattern 4 of a polysilicon wiring pattern having the same width as the gate width of the polysilicon gate is formed to surround a cell region. Like the A cell, the dummy wiring pattern 4 is formed of portions 41 which are parallel to the polysilicon gate 3.

In a standard cell type semiconductor device, basic cells are selected from the basic cell library and laid out on the chip. In this invention, the design process is completed by laying out the basic cells such as the A cell, B cell, C cell shown in FIGS. 11A, 11B and 11C on the chip and then the chip forming process is started.

Since it is not necessary to newly form a dummy wiring pattern for correcting a variation due to the optical proximity effect at the time of change of the process, the process can be simplified.

As described before, a variation in the width due to the optical proximity effect occurs in the wiring pattern, but in some cases, a reduction in the width of the wiring depending on the layout may occur, and it is also important to compensate for the reduction in order to precisely form the wiring pattern. The dummy wiring pattern of this invention can effectively cope with this compensation.

FIG. 12 is a plan view showing a chip on which standard cells are laid out. On the chip 10 of FIG. 12, basic cells (A, B, C) registered in the basic cell library are placed. The basic cells A to C are successively placed in a preset position in an order of ABC. In the positional relation between a target polysilicon gate 3 and an adjacent polysilicon gate 3 on the chip 10, a distance between the polysilicon gates varies depending on a difference in the layout of the basic cells on the chip, but the value correction of a mask for pattern formation for compensating for the optical proximity effect can be automatically made by effecting the layout process.

Figures 13A, 13B, 13C:
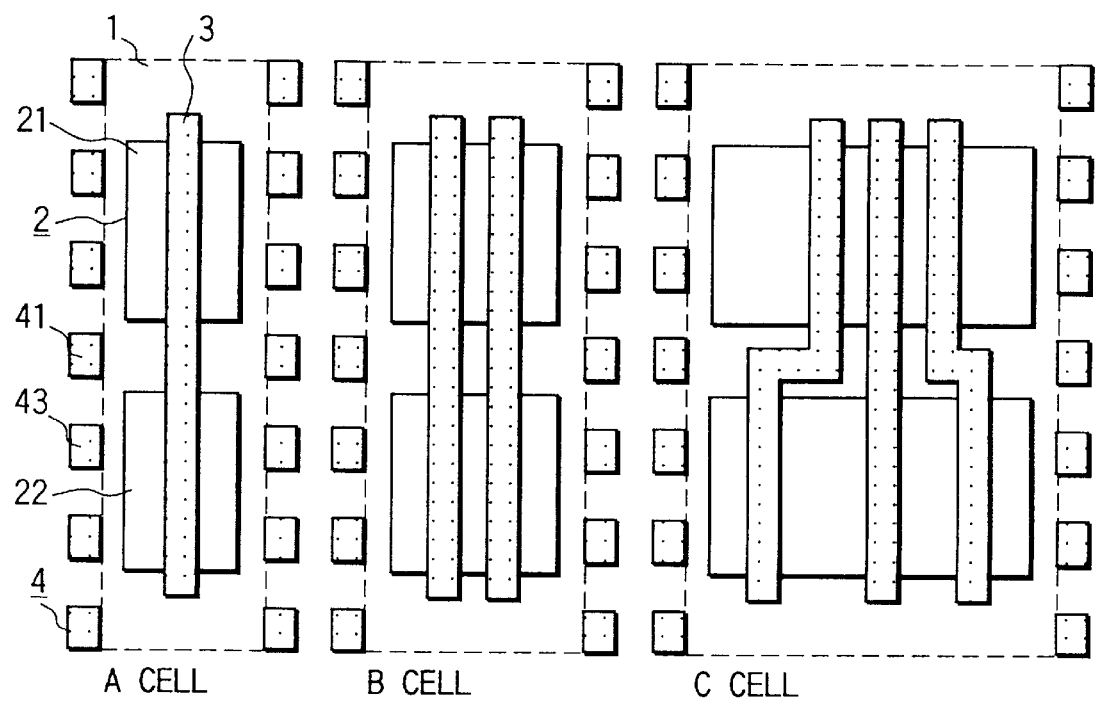
FIGS. 13A, 13B and 13C are plan views showing basic cells of the basic cell library of this invention.
Figure 14:
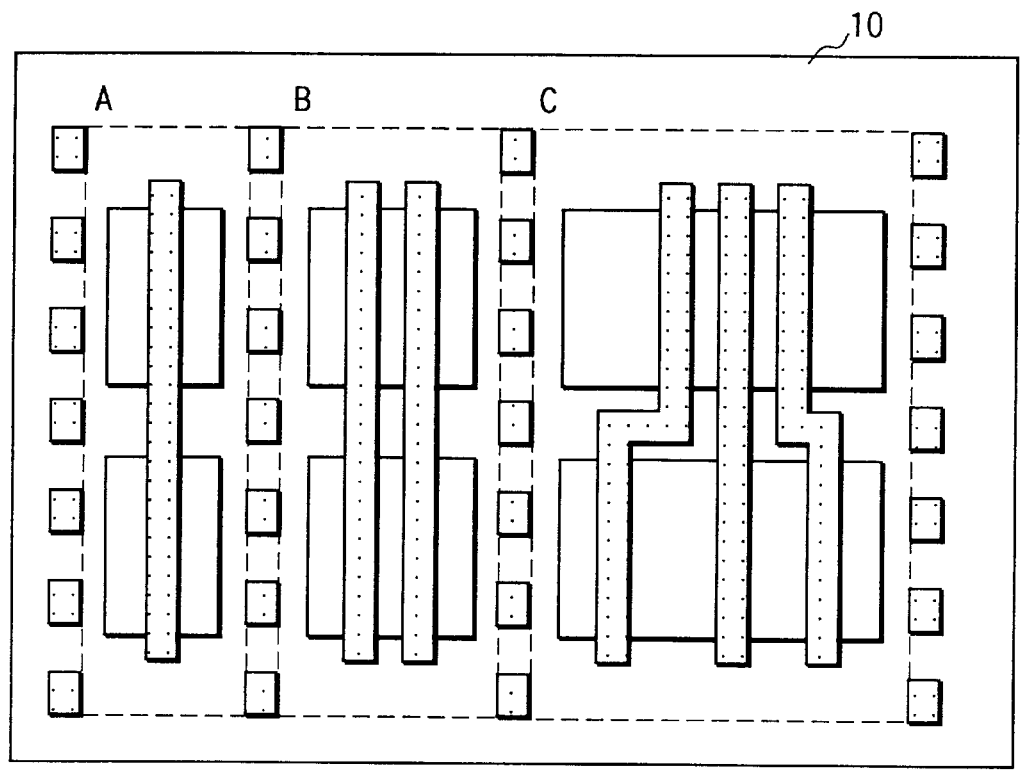
FIG. 14 is a plan view showing a chip on which the basic cells of FIGS. 13A, 13B and 13C are arranged.

Next, a fourth embodiment is explained with reference to FIGS. 13A, 13B, 13C and FIG. 14. FIGS. 13A, 13B and 13C are plan views showing basic cells in the basic cell library of this invention, and FIG. 14 is a plan view showing a chip on which the basic cells of FIGS. 13A, 13B and 13C are placed. The basic cells shown in the drawing are used for the layout of a standard cell type semiconductor device. FIG. 13A shows an A cell registered in the basic cell library. The basic cell has a dummy wiring pattern 4 of a polysilicon wiring pattern formed along a cell frame 1 which defines a cell region. In this embodiment, the dummy wiring pattern 4 is formed of only portions 41 which are parallel to the polysilicon gate 3 and the parallel portion is constructed by a plurality of small portions 43 arranged on one row. Like the third embodiment, since the parallel portion 41 causes a variation in the gate width due to the optical proximity effect in the polysilicon gate 3, the dummy wiring pattern 4 does not necessarily require portions which are perpendicular to the polysilicon gate 3. The structure in the cell region is the same as that in the basic cell (A cell) shown in FIG. 11A. Since the distance between the polysilicon gate 3 and the dummy wiring pattern 4 is constant, correction can be previously made in the state of basic cell if a variation in the gate width occurs in the polysilicon gate 3.

FIG. 13B shows a B cell registered in the basic cell library, and the structure in the cell region is the same as that in the basic cell (B cell) of FIG. 11B. A dummy wiring pattern 4 of a polysilicon wiring pattern having the same width as the gate width of the polysilicon gate is formed to surround the cell region. Like the A cell, the dummy wiring pattern 4 is formed of portions 41 which are parallel to the polysilicon gate 3 and the parallel portion is constructed by a plurality of small portions 43 placed on one row. FIG. 13C shows a C cell registered in the basic cell library, and the structure in the cell region is the same as that in the basic cell (C cell) of FIG. 11C. Like the A cell, the dummy wiring pattern 4 is formed of portions 41 which are parallel to the polysilicon gate 3 and the parallel portion 41 is constructed by a plurality of small portions 43 placed on one row.

Since the dummy wiring pattern is constructed by the small portions, it is possible to form the dummy wiring pattern according to a necessary covering rate.

In a standard cell type semiconductor device, basic cells are selected from the basic cell library and laid out on the chip. In the manufacturing process of the semiconductor device of this invention, the design process is completed by laying out the basic cells such as the A cell, B cell, C cell shown in FIGS. 13A, 13B and 13C on the chip and then the chip forming process is started.

Since it is not necessary to newly form a dummy wiring pattern for correcting a variation due to the optical proximity effect at the time of change of the process, the process can be simplified.

As described before, a variation in the width due to the optical proximity effect occurs in the wiring pattern, but in some cases, a reduction in the width of the wiring depending on the layout may occur, and it is also important to compensate for the reduction in order to precisely form the wiring pattern. The dummy wiring pattern of this invention can effectively cope with this compensation.

FIG. 14 is a plan view showing a chip on which standard cells are laid out. On the chip 10 of FIG. 14, basic cells (A, B, C) registered in the basic cell library of FIGS. 13A, 13B and 13C are placed. The basic cells A to C are successively placed in a preset position in an order of ABC. In the positional relation between a target polysilicon gate 3 and an adjacent polysilicon gate 3 on the chip 10, a distance between the polysilicon gates varies depending on a difference in the layout of the basic cells on the chip, but the value correction of a mask for pattern formation for compensating for the optical proximity effect can be automatically made by effecting the layout process.

Figure 15:
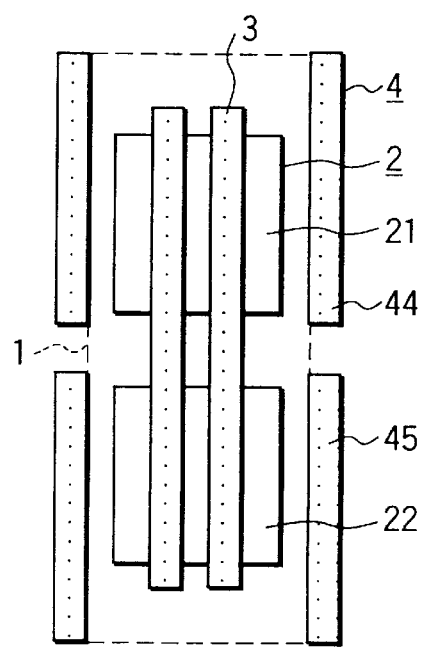
FIG. 15 is a plan view showing a basic cell of the basic cell library of this invention.
Figure 16:
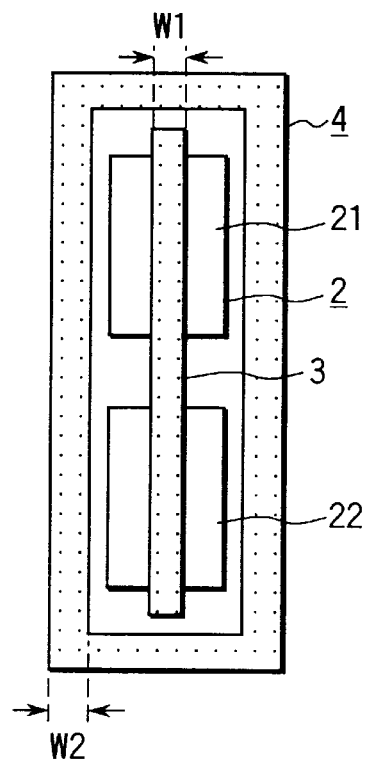
FIG. 16 is a plan view showing a basic cell of the basic cell library of this invention.
Figure 17:
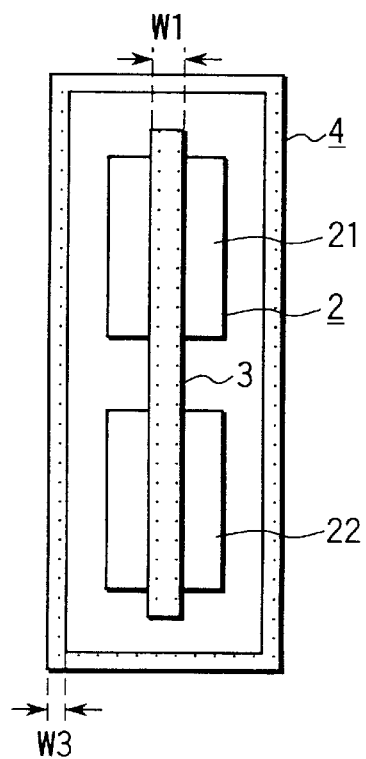
FIG. 17 is a plan view showing a basic cell of the basic cell library of this invention.

Next, a fifth embodiment is explained with reference to FIGS. 15 to 17. FIGS. 15 to 17 are plan views showing basic cells in the basic cell library of this invention. The basic cells are used for the layout of a standard cell type semiconductor device. The basic cell of FIG. 15 has a dummy wiring pattern 4 of a polysilicon wiring pattern formed along a cell frame 1 which defines a cell region. In this embodiment, the dummy wiring pattern 4 is formed of only portions which are parallel to the polysilicon gate 3 and the parallel portion is constructed by a plurality of small portions placed on one row.

Since the parallel portion causes a variation in the gate width due to the optical proximity effect in the polysilicon gate 3, the dummy wiring pattern 4 does not necessarily require portions which are perpendicular to the polysilicon gate 3. One pair of diffusion regions 2 used as source/drain regions are formed in the cell region. The diffusion regions 2 include a p+ diffusion region 21 and an n+ diffusion region 22 and two polysilicon gates 3 are each formed to extend over the diffusion regions 21, 22. In this embodiment, the gate width of the polysilicon gate 3 and the pattern width of the dummy wiring pattern 4 are both set to 0.3 $\mu$m, for example. In the basic cell in the drawing, the small portion has substantially the same size as the diffusion region. That is, the diffusion region 21 is formed to face a small portion 44 and the diffusion region 22 is formed to face a small portion 45.

Since the distance between the polysilicon gate 3 and the dummy wiring pattern 4 is constant, correction can be previously made in the state of basic cell if a variation in the gate width occurs in the polysilicon gate 3. Further, since the dummy wiring pattern is divided, it is possible to form the dummy wiring pattern according to a necessary covering rate.

The basic cell of FIG. 16 has a dummy wiring pattern 4 of a polysilicon wiring pattern formed along a cell frame which defines a cell region. In this embodiment, the dummy wiring pattern 4 is formed to completely surround an element region in which the polysilicon gate 3 is formed. The pattern width w2 of the dummy wiring pattern 4 is made larger than the gate width w1 of the polysilicon gate 3 (w2>w1). Thus, the widths of the dummy wiring pattern and the polysilicon gate can be suitably changed. The basic cell of FIG. 17 has a dummy wiring pattern 4 of a polysilicon wiring pattern formed along a cell frame which defines a cell region. Like the case of FIG. 16, the dummy wiring pattern 4 is formed to completely surround an element region in which the polysilicon gate 3 is formed. The pattern width w3 of the dummy wiring pattern 4 is made smaller than the gate width w1 of the polysilicon gate 3 (w3<w1). The area of the basic cell formed on the chip can be reduced by setting the pattern width smaller than the gate width.

Further, this invention can be applied not only to the polysilicon wiring gate but also to a metal wiring of aluminum or another layer.

Figure 18:
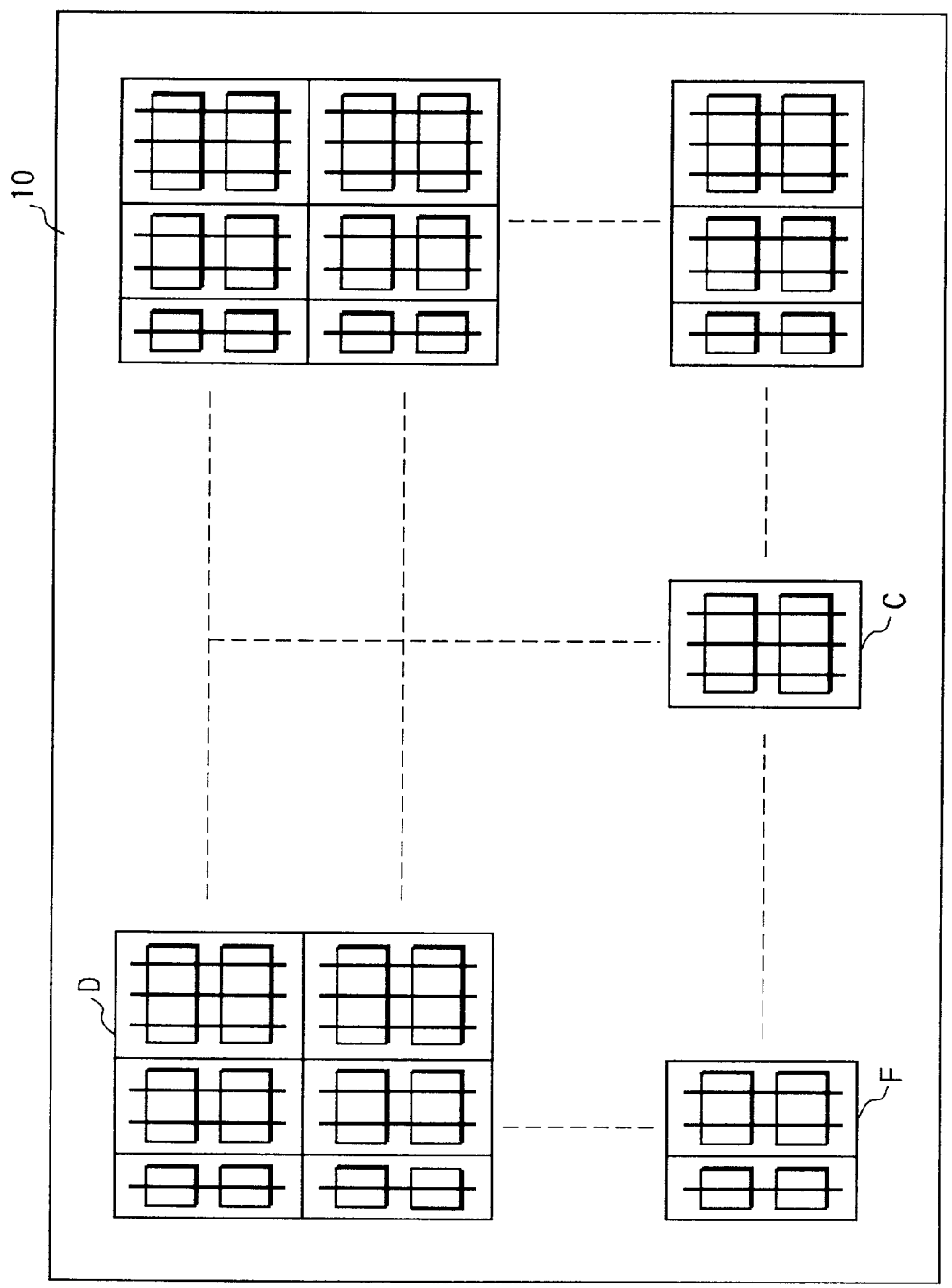
FIG. 18 is a plan view showing a chip layout based on the basic cell of this invention.

FIG. 18 shows a sixth embodiment. In FIG. 18, a reference numeral 10 denotes a chip of an integrated circuit constructed by basic cells selectively taken out from the basic cell library of this invention. D, F, C in FIG. 18 denote basic cells, and since a dummy pattern is formed in each basic cell, it is not necessary to perform the OPC process for the whole portion of the chip and TAT can be reduced even if the integrated circuit is formed in a manner as shown in FIG. 18.

The distance between a polysilicon gate used in a circuit and an adjacent dummy wiring pattern of a polysilicon wiring in the basic cell can be determined in the cell by previously forming means for compensating for the optical proximity effect in the cell frame of the basic cell registered in the basic cell library. As a result, since the amounts of variations in the poly-widths due to the optical proximity effect in all of the polysilicon gates in the basic cell can be estimated, a correction value by the OPC technique on the mask for correcting the gate width based on the variation in the poly-width can be determined only in the cell. Further, since the basic cell library is subjected to the correction by the OPC technique before cells of the product are arranged, it is not necessary to perform the OPC process at the time of development of the product, it is possible to prevent the delay in TAT caused by correction by the OPC technique for each product and an adequate mask of a polysilicon wiring pattern can be easily formed. Further, the amount of correction processing data can be made smaller than in the case of correction for the whole portion of the chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:
   a semiconductor substrate;
   a logic circuit formed on the semiconductor substrate, the logic circuit including a gate electrode; and
   a dummy wiring pattern formed at a peripheral portion of the logic circuit.

2. The semiconductor device of claim 1, wherein the logic circuit is one of an AND gate circuit, a NAND gate circuit, an EX-OR gate circuit, a NOR gate circuit, an inverter circuit, and a flip-flop circuit.

3. The semiconductor device of claim 1, wherein a width of the gate electrode is dependent upon a distance between the gate electrode and the dummy wiring pattern.

4. The semiconductor device of claim 3, wherein the distance between the gate electrode and the dummy wiring pattern is predetermined and the width of the gate electrode is selected to compensate for an optical proximity effect.

5. The semiconductor device of claim 1, wherein a width of the gate electrode is less than or equal to 0.3 $\mu$m.

6. The semiconductor device of claim 1, wherein a width of the gate electrode is substantially the same as a width of the dummy wiring pattern.

7. The semiconductor device of claim 1, wherein a width of the gate electrode is different than a width of the dummy wiring pattern.

8. The semiconductor device of claim 1, wherein the gate electrode and the dummy wiring pattern are formed of polysilicon.

9. The semiconductor device of claim 1, wherein the dummy wiring pattern completely surrounds the logic circuit.

10. The semiconductor device of claim 1, wherein the dummy wiring pattern is parallel to a length of the gate electrode.

11. The semiconductor device of claim 1, wherein the dummy wiring pattern comprises a plurality of dummy wiring portions.

12. A semiconductor device comprising:
    a semiconductor substrate;
    a plurality of logic circuits formed on the semiconductor substrate, each of the plurality of logic circuits including a gate electrode; and
    a dummy wiring pattern formed at a peripheral portion of the plurality of logic circuits and between adjacent ones of the plurality of logic circuits.

13. The semiconductor device of claim 12, wherein each of the plurality of logic circuits is one of an AND gate circuit, a NAND gate circuit, an EX-OR gate circuit, a NOR gate circuit, an inverter circuit, and a flip-flop circuit.

14. The semiconductor device of claim 12, wherein a width of each of the gate electrodes is dependent upon a distance between the gate electrode and the dummy wiring pattern.

15. The semiconductor device of claim 14, wherein the distance between the gate electrode and the dummy wiring pattern is predetermined and the width of each gate electrode is selected to compensate for an optical proximity effect.

16. The semiconductor device of claim 12, wherein a width of each of the gate electrodes is less than or equal to 0.3 $\mu$m.

17. The semiconductor device of claim 12, wherein a width of each of the gate electrodes is substantially the same as a width of the dummy wiring pattern.

18. The semiconductor device of claim 12, wherein a width of each of the gate electrodes is different than a width of the dummy wiring pattern.

19. The semiconductor device of claim 12, wherein the gate electrodes and the dummy wiring pattern are formed of polysilicon.

20. The semiconductor device of claim 12, wherein the dummy wiring pattern completely surrounds the plurality of logic circuits.

21. The semiconductor device of claim 12, wherein the dummy wiring pattern is parallel to a length of each of the gate electrodes.

22. The semiconductor device of claim 12, wherein the dummy wiring pattern comprises a plurality of dummy wiring portions.

23. A logic cell library comprising:
    a plurality of logic cells, each logic cell including a logic circuit including a gate electrode, and a dummy wiring pattern located at a peripheral portion of the logic circuit;

wherein a distance between the gate electrode and the dummy wiring pattern of each logic circuit cell is predetermined and the width of the gate electrode is selected to compensate for an optical proximity effect.

24. The cell library of claim 23, wherein the logic circuit of each logic cell is one of an AND gate circuit, a NAND gate circuit, an EX-OR gate circuit, a NOR gate circuit, an inverter circuit, and a flip-flop circuit, and wherein each logic cell corresponds to a different logic circuit.

25. The cell library of claim 23, wherein a width of each of the gate electrodes is dependent upon a distance between the gate electrode and the dummy wiring pattern.

26. The cell library of claim 23, wherein a width of each of the gate electrodes is less than or equal to 0.3 $\mu$m.

27. The cell library of claim 23, wherein a width of each of the gate electrodes is substantially the same as a width of the dummy wiring pattern.

28. The cell library of claim 23, wherein a width of each of the gate electrodes is different than a width of the dummy wiring pattern.

29. The cell library of claim 23, wherein the gate electrodes and the dummy wiring pattern are formed of polysilicon.

30. The cell library of claim 23, wherein the dummy wiring pattern completely surrounds the logic circuit.

31. The cell library of claim 23, wherein the dummy wiring pattern is parallel to a length of each of the gate electrodes.

32. The cell library of claim 23, wherein the dummy wiring pattern comprises a plurality of dummy wiring portions.

33. A logic cell library comprising:

a plurality of logic cells, at least one of the logic cells including a plurality of logic circuits, each including a gate electrode, and a dummy wiring pattern located at a peripheral portion of the plurality of logic circuits and located between adjacent ones of the plurality of logic circuits;

wherein a distance between the gate electrode of each of the plurality of logic circuits and the dummy wiring pattern is predetermined and the width of each gate electrode is selected to compensate for an optical proximity effect.

34. The cell library of claim 33, wherein each of the plurality of logic circuits is one of an AND gate circuit, a NAND gate circuit, an EX-OR gate circuit, a NOR gate circuit, an inverter circuit, and a flip-flop circuit.

35. The cell library of claim 33, wherein a width of each of the gate electrodes is dependent upon a distance between the gate electrode and the dummy wiring pattern.

36. The cell library of claim 33, wherein a width of each of the gate electrodes is less than or equal to 0.3 $\mu$m.

37. The cell library of claim 33, wherein a width of each of the gate electrodes is substantially the same as a width of the dummy wiring pattern.

38. The cell library of claim 33, wherein a width of each of the gate electrodes is different than a width of the dummy wiring pattern.

39. The cell library of claim 33, wherein the gate electrodes and the dummy wiring pattern are formed of polysilicon.

40. The cell library of claim 33, wherein the dummy wiring pattern completely surrounds the plurality of logic circuits.

41. The cell library of claim 33, wherein the dummy wiring pattern is parallel to a length of each of the gate electrodes.

42. The cell library of claim 33, wherein the dummy wiring pattern comprises a plurality of dummy wiring portions.

43. A semiconductor integrated circuit, comprising:

a semiconductor substrate;

a logic circuit formed on the semiconductor substrate and including a gate electrode; and a dummy wiring pattern formed at a peripheral portion of the logic circuit, said dummy wiring pattern including first and second wiring patterns located on opposite sides of the gate electrode and parallel to a length of the gate electrode.

44. The semiconductor integrated circuit of claim 43, wherein each of the first and second wiring patterns comprises a plurality of dummy wiring portions.

45. The semiconductor integrated circuit of claim 43, wherein each of the first and second wiring patterns is continuous.

46. The semiconductor integrated circuit of claim 43, further including third and fourth wiring patterns perpendicular to and contiguous with the first and second wiring patterns, so that said dummy wiring pattern surrounds said logic circuit.

47. A semiconductor integrated circuit, comprising:

a semiconductor substrate;

a logic circuit formed on the semiconductor substrate and including first and second gate electrodes; and a dummy wiring pattern formed at a peripheral portion of the logic circuit, said dummy wiring pattern including first and second wiring patterns respectively located parallel to a length of each of the first and second gate electrodes.

48. The semiconductor integrated circuit of claim 47, wherein each of the first and second wiring patterns comprises a plurality of dummy wiring portions.

49. The semiconductor integrated circuit of claim 47, wherein each of the first and second wiring patterns is continuous.

50. The semiconductor integrated circuit of claim 47, further including third and fourth wiring patterns perpendicular to and contiguous with the first and second wiring patterns, so that said dummy wiring pattern surrounds said logic circuit.

51. A semiconductor integrated circuit, comprising:

a semiconductor substrate;

a first logic circuit formed on the semiconductor substrate and including a first gate electrode;

a second logic circuit formed on the semiconductor substrate next to the first logic circuit and including a second gate electrode parallel to the first gate electrode;

a first dummy wiring pattern located at a peripheral portion of the first logic circuit remote from the second logic circuit and parallel to a length of the first gate electrode; and a second dummy wiring pattern located at a peripheral portion of the second logic circuit remote from the first logic circuit and parallel to a length of the second gate electrode.

52. The semiconductor integrated circuit of claim 51, wherein each of the first and second dummy wiring patterns comprises a plurality of dummy wiring portions.

53. The semiconductor integrated circuit of claim 51, wherein each of the first and second wiring patterns is continuous.

54. The semiconductor integrated circuit of claim 51, further including a third dummy wiring pattern located between the first and second logic circuits and parallel to the first and second gate electrodes.

55. The semiconductor integrated circuit of claim 54, further including fourth and fifth dummy wiring patterns perpendicular to and contiguous with first and second ends, respectively, of the first, second and third dummy wiring patterns.

* * * * *